United States Patent
Lee et al.

(10) Patent No.: US 7,148,116 B2
(45) Date of Patent: Dec. 12, 2006

(54) SEMICONDUCTOR DEVICE WITH LOAD RESISTOR AND FABRICATION METHOD

(75) Inventors: Won Shik Lee, Youngin (KR); Joon-Mo Kwon, Suwon (KR); Tae Kyung Kim, Seoul (KR); Jin-Kee Choi, Seoul (KR); Dong-Gun Park, Sungnam (KR); Hyeong-Chan Ko, Youngin (KR); Hong-Joon Moon, Suwon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/169,894

(22) Filed: Jun. 30, 2005

(65) Prior Publication Data

US 2005/0255662 A1 Nov. 17, 2005

(30) Foreign Application Priority Data

Mar. 22, 2002 (KR) ................................ 2002-15753

(51) Int. Cl.
*H01L 29/76* (2006.01)
(52) U.S. Cl. ................................ 438/382; 257/E21.004
(58) Field of Classification Search ................ 438/381, 438/382
See application file for complete search history.

(56) References Cited

U.S. PATENT DOCUMENTS

| 3,971,061 | A | 7/1976 | Matsushita et al. | |
|---|---|---|---|---|
| 3,996,551 | A | 12/1976 | Croson | |
| 4,146,882 | A | 3/1979 | Hoff, Jr. et al. | |
| 4,757,368 | A | 7/1988 | Masunaga et al. | |
| 5,242,225 | A | 9/1993 | Kasanami et al. | |
| 5,994,742 | A * | 11/1999 | Krishnan et al. | 257/355 |
| 6,110,841 | A * | 8/2000 | Wang et al. | 438/766 |
| 6,201,286 | B1 | 3/2001 | Nagasaka | |
| 6,269,695 | B1 | 8/2001 | Cesternino et al. | |
| 6,294,872 | B1 | 9/2001 | Tsuruoka et al. | |
| 6,458,670 | B1 | 10/2002 | Nagasaka | |
| 6,534,804 | B1 * | 3/2003 | Tsuchiya | 257/203 |

FOREIGN PATENT DOCUMENTS

JP        2002-270776        *  9/2002

OTHER PUBLICATIONS

J. Choi, et al. "New Process Damage During the Etching of Small-Contact on Long Floating Conductor Layer", IEEE, 41st Annual International Reliability Physics Symposium, Dallas, TX 2003, pp. 303-306.*
U.S. Appl. No. 10/270,563, filed Oct. 2002, Lee et al.

* cited by examiner

*Primary Examiner*—W. David Coleman
(74) *Attorney, Agent, or Firm*—Harness, Dickey & Pierce, P.L.C.

(57) ABSTRACT

A semiconductor device with a load resistor is manufactured such that a contact is formed at both ends of the load resistor, and at least one contact is formed between the contacts, in order to prevent impurities from being generated within each contact while the contacts are being generated by etching an insulation layer phenomena of electric charge build up from occurring when an etching process fabricates an insulation layer to generate the contact in a long load resistor located under the insulation layer and insulated electrically and physically.

14 Claims, 5 Drawing Sheets

SEMICONDUCTOR DEVICE WITH LOAD RESISTOR AND FABRICATION METHOD

PRIORITY STATEMENT

This application claims priority upon U.S. application Ser. No. 10/270,563 filed Oct. 16, 2002, which claims priority to Korean Patent Application No. 2002-15753, filed on Mar. 22, 2002, the disclosure of which is incorporated herein in its entirety by reference.

BACKGROUND OF THE INVENTION

1. Field of the Invention

The present invention relates to semiconductor devices and a method for fabricating semiconductor devices, and more particularly, to a semiconductor device and a method for fabricating the semiconductor device in order to prevent impurities, such as a contaminant or residue, from being generated within a contact of a load resistor.

2. Description of the Related Art

Generally, a load resistor is arranged in the peripheral areas of a semiconductor device, such as a dynamic random access memory (DRAM). The load resistor, mainly comprised of a plate polysilicon layer (P-Poly) or a metal pattern, may vary in length from a few micrometers (μm) to hundreds of micrometers (μm). Such a load resistor is insulated electrically and physically.

A long load resistor, which is applied to a semiconductor device as a plate polysilicon layer (P-Poly), is insulated by the application of an insulation layer. In such a configuration, contacts (e.g., metal contacts) are fabricated at both ends of the load resistor to connect the load resistor to a metal pattern deposited above the insulation layer.

In the electrical circuit of the semiconductor device, such contacts have the important role of connecting a layer with another heterogeneous layer, for example, connecting a polysilicon layer with a metal pattern. As the semiconductor device becomes increasingly integrated, the aspect ratios, i.e., the ratios of length to width, of the contacts increase. Therefore, each contact becomes narrower, making it difficult to perform an etching process because of the tight margin of the contact fabrication.

FIGS. 1A and 1B illustrate planar and cross-sectional views of a prior art structure in which metal patterns 140 are connected to a long load resistor 110 through metal contacts 130 according to the prior art.

Referring to FIGS. 1A and 1B, a load resistor 110 is relatively long with respect to its length and width. Such a load resistor 110 has a winding shape on a semiconductor substrate 100. After the load resistor is fabricated on the semiconductor substrate 100, an insulation layer 120 is deposited on the substrate 100 above of the load resistor 110. A dry-etching process is applied to the insulation layer 120, in order to expose both ends of the load resistor 110 to fabricate contact holes. A contact plug 135 fills each of the contact holes to form contacts 130 with the load resistor 110. The contact plug 135 is fabricated from a conductive material, such as tungsten (W), tungsten silicide (WSi), polysilicon, or aluminum (Al). A metal pattern 140 is then formed over the substrate 100 and in contact with contact plugs 135.

As discussed above, the conventional process of electrically connecting a metal pattern 140 to the load resistor 110 involves using a dry-etching process to create the contact hole, which is filled with the contact plug 135. During this process, plasma ions or etching residues accumulate on the surface of the load resistor 110.

FIG. 2 is an image captured by a scanning electron microscope (SEM), which shows contacts 231 and 232 fabricated on load resistors of a plate polysilicon layer according to the conventional process. Referring to FIG. 2, contacts 231 are placed at both ends of a polysilicon layer (load resistor) with a considerably small length, and contacts 232 are placed at the ends of a considerably long polysilicon layer. No significant electric charge build up occurs within the contacts 231 of the considerably short polysilicon layer. However, a significant electric charge build up occurs within the contacts 232 at both ends of the considerably long polysilicon layer. The accumulated electric charge in the contacts 232 results from local concentrations of electric charge, which occur during the plasma etching process of an insulation layer 120. During the plasma etching process, the considerably long load resistor 110 under the insulation layer 120 has a floating electrical state.

As described above, the accumulation of electric charge depends on the length of the load resistor. In the case of plate polysilicon layer with sheet resistance of 60 $\Omega/cm^2$ and width of 1.7 μm, an electric charge does not build up when the length of the load resistor is 9,000 μm. However, a build up of electric charge will occur when the length of the load resistor is 16,000 μm.

FIG. 3 is an image captured by a transmission electron microscope TEM, which illustrates impurities, such as an insulating material, that are generated between the load resistor and the contact plug by the electric charge build up that occurs in the prior art.

Referring to FIG. 3, plasma ions or etching residues generated by the electric charge build up during the application of a plasma etching process to an insulation layer E. This transforms the physical and chemical characteristics of the interface between the load resistor and the contact plug, thereby generating impurities, such as an insulating material D. Therefore, the electric charge build up degrades the conductivity of the interface between the load resistor and the contact plug, not only making it difficult to obtain a fine contact characteristic, but also altering electric potentials and creating abnormal contact profiles.

SUMMARY OF THE INVENTION

The present invention is directed to a process of fabricating a semiconductor device including a long load resistor and an insulating layer, in which electric charge build up is dissipated while the dry etching process is performed on the insulation layer. During the etching process, contacts are formed at each end of a long load resistor, and at least one additional dummy contact is formed between the ends to dissipate an electric charge build up within the contacts. The dissipation of the electric charge build up helps prevent impurities, e.g., insulating material, from being generated within the contacts.

In an exemplary embodiment, the dummy contacts do not connect a metal or conductive pattern to the load resistor of the semiconductor device. In an alternative embodiment, at least one dummy conductive pattern is connected to the load resistor through the dummy contacts. In this alternative embodiment, the dummy conductive pattern may be connected to the load resistor through two neighboring dummy contacts.

In another exemplary embodiment, the load resistor is formed as multiple divided-resistor patterns over the substrate. Contacts are formed on the ends of the load resistor and therebetween, such that the ends of each divided-resistor pattern includes a contact, respectively. In this embodiment, a metal or conductive pattern connects the ends of neighboring divided-resistor patterns through the contacts. By forming a load resistor from a series of shorter divided-resistor patterns, the load resistor may obtain the resistance characteristics of a long load resistor, while avoiding an electric charge build up during the etching process normally associated with long load resistors.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF EXEMPLARY EMBODIMENTS

Reference will now be made in detail to preferred embodiments of the present invention, examples of which are illustrated in the accompanying drawings.

Figure 1A:
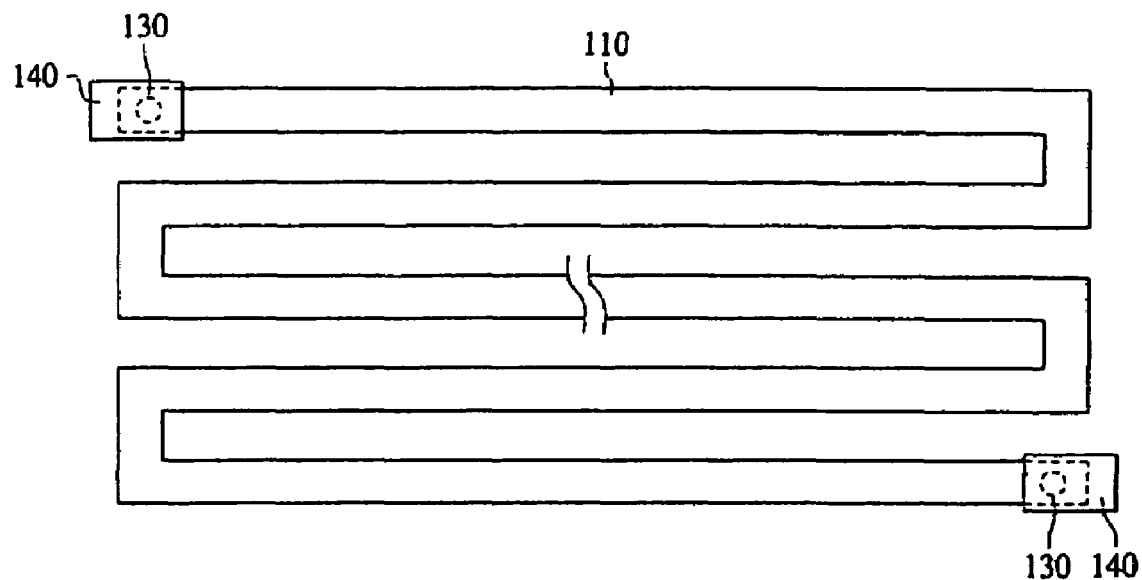
FIGS. 1A and 1B illustrate planar and cross-sectional views of a structure in which a metal pattern is connected to a long load resistor through a metal contact according to the prior art.
Figure 1B:
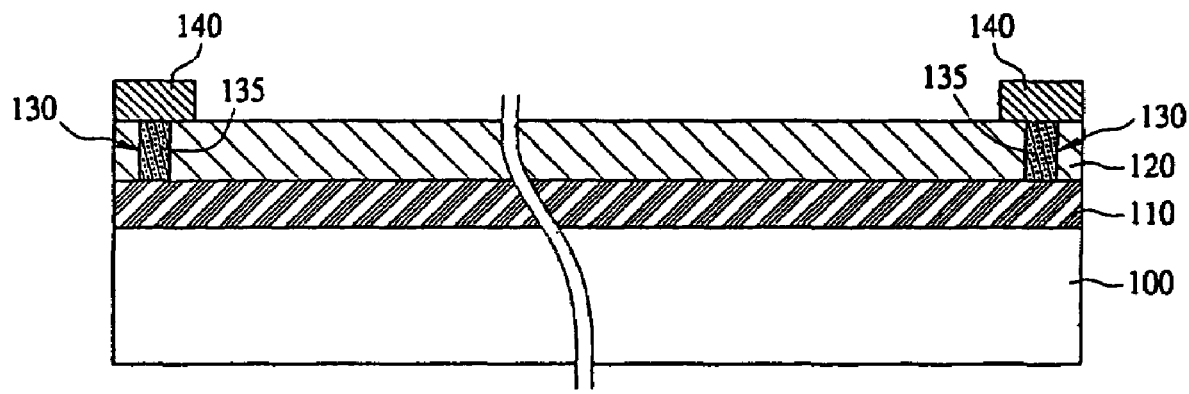
Figure 2:
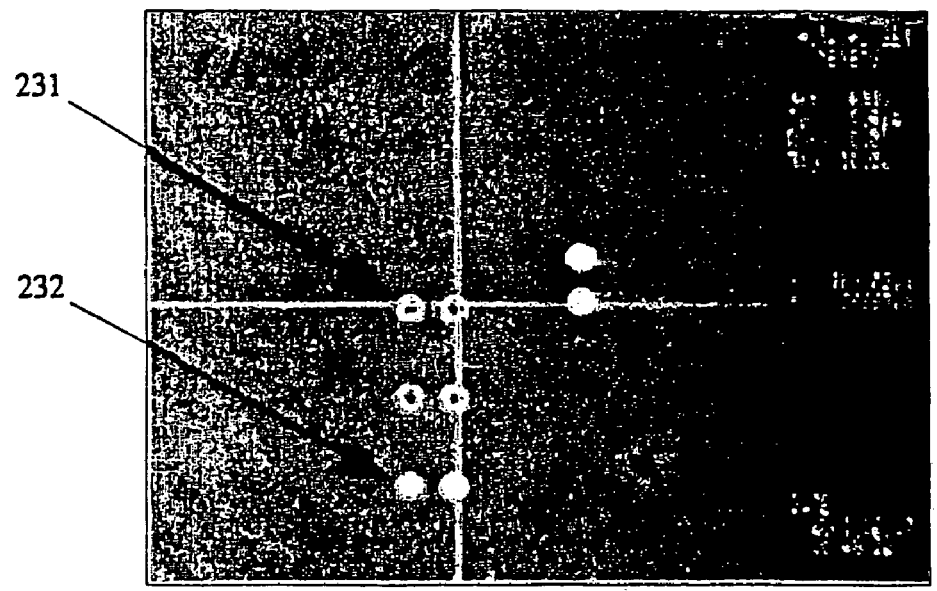
FIG. 2 is an image taken by a scanning electron microscope (SEM), which shows a metal contact fabricated on a load resistor of a plate polysilicon layer according to the prior art.
Figure 3:
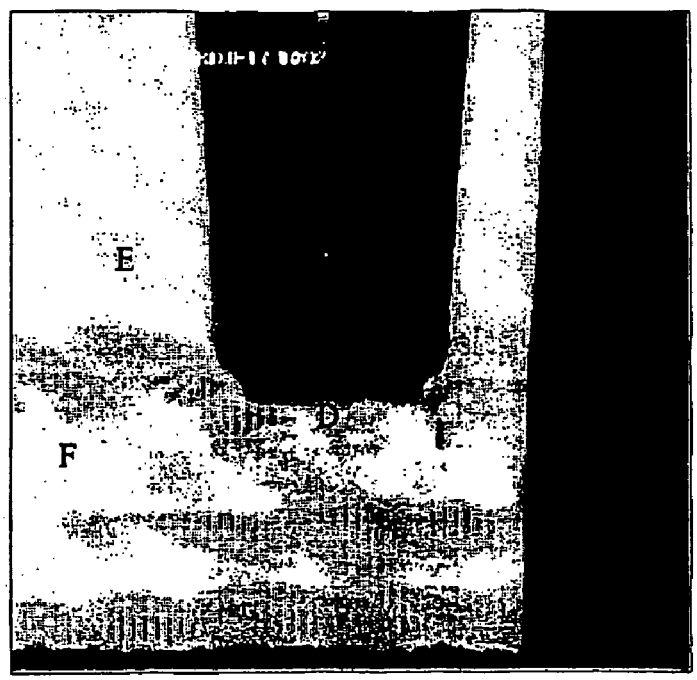
FIG. 3 is an image taken by a transmission electron microscope (TEM) illustrating impurities between the load resistor and the contact plug, which are generated by the electric charge build up that occurs in the prior art.
Figure 4A:
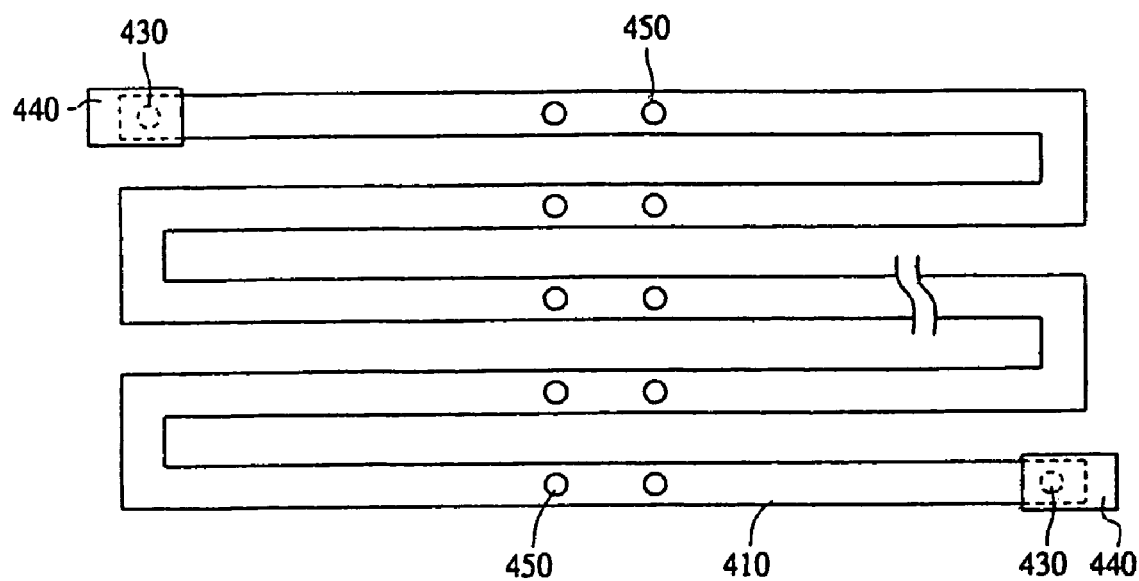
FIGS. 4A and 4B illustrate planar and cross-sectional views of a semiconductor device, which includes a functional conductive pattern connected to a long load resistor via contacts according to a first exemplary embodiment of the present invention.
Figure 4B:
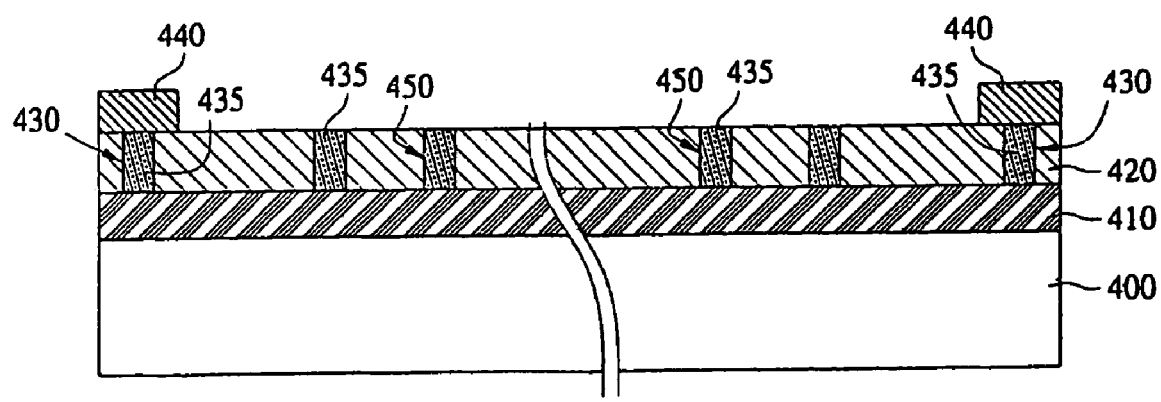

FIGS. 4A and 4B are drawings illustrating planar structure and cross-sectional schemes of a semiconductor device comprising a metal line connected with a long load resistor through a contact according to the first embodiment of the present invention.

Referring to FIGS. 4A and 4B, in the first embodiment of the present invention, the length of a load resistor 410 is considerably long, and the load resistor 410 is insulated electrically and physically. Additionally, the load resistor 410 has a zigzag shape. The load resistor 410 comprises a contact 430 arranged at both ends of the load resistor 410. The contact 430 at each end electrically connects the load resistor 410 with a metal pattern 440. At least one dummy contact 450 arranged between the contacts 430 and disconnected with the metal pattern 440. The metal pattern 440 is connected with the load resistor 410 through the contact 430.

The metal pattern 440 described above with respect to FIGS. 4A and 4B is merely a type of a functional conductive pattern, which may be connected to the long load resistor by the contacts 430. It will be readily apparent to those skilled in the art that the metal pattern 440 may be replaced by another type of functional conductive pattern, which is formed of a suitable conductive material other than metal.

In the semiconductor device according to the first embodiment of the present invention, the resistance value of the load resistor 410 is determined by a resistance value, width, and length in a conductive material of the load resistance.

Referring to a method for fabricating a semiconductor device according to the first embodiment of the present invention, as shown in FIG. 4b, a conductive material such as a plate polysilicon layer is deposited on the semiconductor substrate 400, and patterned into a long load resistor 410, with a zigzag shape, isolated electrically and physically.

In more detail, after an insulation layer 420 on the semiconductor substrate 400 is deposited and dry-etched by the method for fabricating the semiconductor device according to the first embodiment of the present invention, the dry-etching process fabricates not only the metal contact 430 exposing both ends of the load resistor 410, but also at least one dummy contact 450 exposing a load resistor 410 between the contacts 430.

By fabricating at least one dummy contact 450 between the contacts 430, plasma-etching damage can be dissipated and reduced at both ends of the load resistor 410. Therefore, electric charge build up phenomena within the contact 430 can be prevented while etching the insulation layer 420.

Sequentially, the method for fabricating a semiconductor device according to the first embodiment of the present invention fills up the contact 430 and the dummy contact 450 with a conductive material to form a contact plug 435. As a conductive material for the contact plug 435, tungsten W, tungsten silicide WSi, a polysilicon layer, or aluminum Al is used.

After fabricating the contact plug 435, a metal layer is deposited on the semiconductor substrate 400, and patterned into a metal pattern 440 connected with the load resistor 410 through the contact plug 435. In this case, the contact plug 435 generated on the dummy contact 450 is not connected with the metal pattern 440.

Figure 5A:
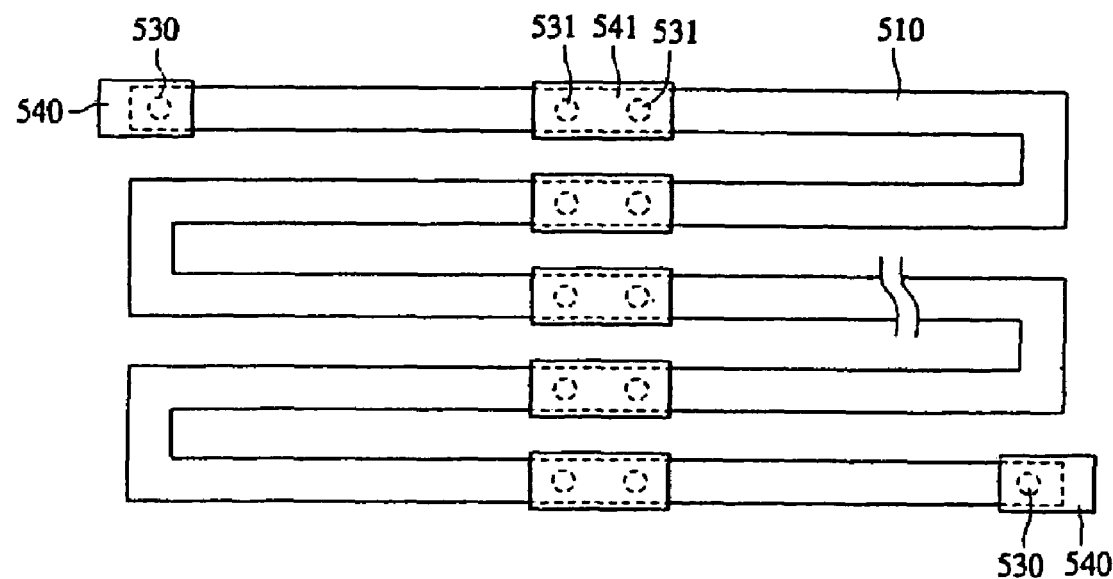
FIGS. 5A and 5B illustrate planar and cross-sectional views of a semiconductor device, which includes a functional conductive pattern connected to a long load resistor via contacts, and dummy conductive patterns connected to the load resistor via dummy contacts, according to a second exemplary embodiment of the present invention.
Figure 5B:
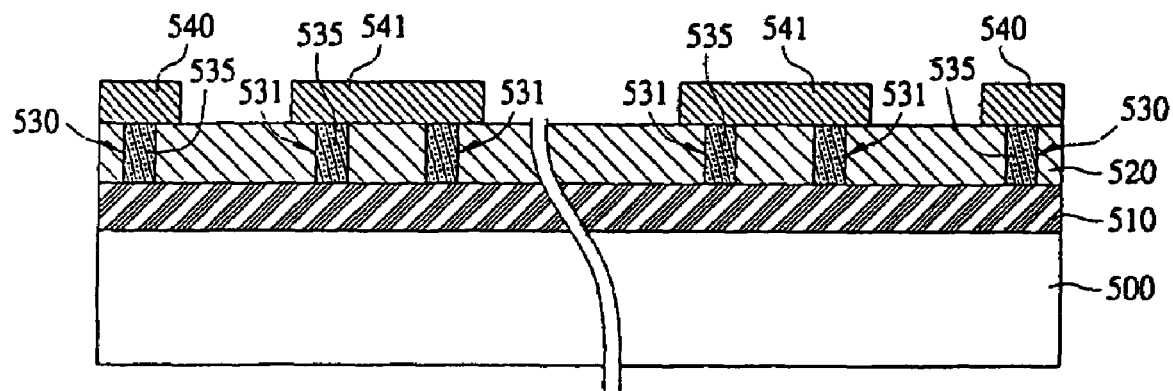

FIGS. 5A and 5B are drawings illustrating planar structure and cross-sectional schemes of a semiconductor device comprising a metal line connected with a long load resistor through a contact according to the second embodiment of the present invention.

Referring to FIG. 5A, in the second embodiment of the present invention, the load resistor 510 is considerably long and isolated electrically and physically, and has a zigzag shape. The load resistor 510 comprises a contact 530 arranged at both ends of the load resistor 510, and at least one dummy contact 531 arranged between the contacts 530. The metal pattern comprises a primary metal pattern, i.e., functional conductive pattern 540, connected with the load resistor 510 through the contact 530, and a secondary metal pattern, i.e., dummy conductive pattern 541, connected with the load resistor 510 through the dummy contact 531. In the second embodiment of the present invention, each of the dummy conductive patterns 541 is connected with the load resistor 510 through two adjacent dummy contacts 531.

Although the functional conductive pattern 540 and the dummy conductive pattern 541 are described above as metal patterns, it will be readily apparent that they may be formed of any suitable conductive material.

Therefore, the resistance value of the load resistor 510 is determined by the resistance value of a conductive metal of the load resistor 510, and the resistance value and the contact resistance value of the metal pattern 540.

Referring to FIG. 5B, the method of fabricating the semiconductor device according to the second embodiment of the present invention deposits and patterns a conductive material, such as a plate polysilicon layer, as a load resistor on the semiconductor substrate 500 to generate the long load resistor 510, with a zigzag shape, insulated electrically and physically.

After depositing an insulation layer 520 on the semiconductor substrate 500 including the load resistor 510, the insulation layer 520 is dry-etched to fabricate a contact 530 exposing both ends of the load resistor 510, and at least one dummy contact 531 exposing the load resistor 510 between the contacts 530.

The second embodiment of the present invention fabricates not only a contact 530 at both ends of the load resistor 510, but also at least one dummy contact 531 between the contacts 530 to dissipate and reduce plasma-etching damage. Therefore, phenomena of the electric charge build up do not happen at the load resistor 510 within the contact 530 during dry-etching process to the insulation layer 520.

Sequentially, the second embodiment of the present invention fills up the contact 530 and the dummy contact 531 with a conductive material to generate a contact plug 535. In this process, tungsten W, tungsten silicide WSi, a polysilicon, or aluminum Al is used as a conductive material for a contact plug 535.

After depositing and patterning a metal layer on the semiconductor substrate 500, the second embodiment of the present invention fabricates at least one metal pattern connected with the load resistor 510 through the contact plug 535. The metal pattern comprises a functional conductive pattern 540 connected with the load resistor 530 through the contact plug 535 generated in the contact 530, and a dummy conductive pattern 541 connected with the load resistor 510 through the contact plug 535 generated in the dummy contact 531. In the second embodiment of the present invention, the metal pattern 541 is connected with the load resistor 510 through two neighboring contact plugs 535 generated in the dummy contacts 531

Figure 6A:
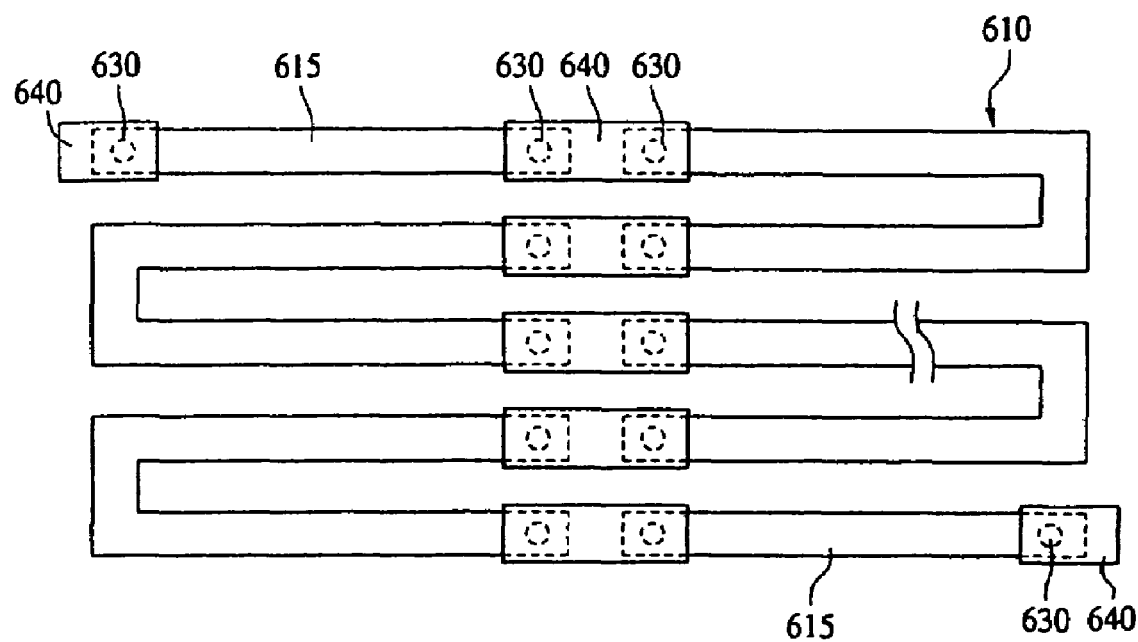
FIGS. 6A and 6B illustrate planar and cross-sectional views of a semiconductor device, which includes a functional conductive patterns connected to a long load resistor via contacts according to a third exemplary embodiment of the present invention.
Figure 6B:
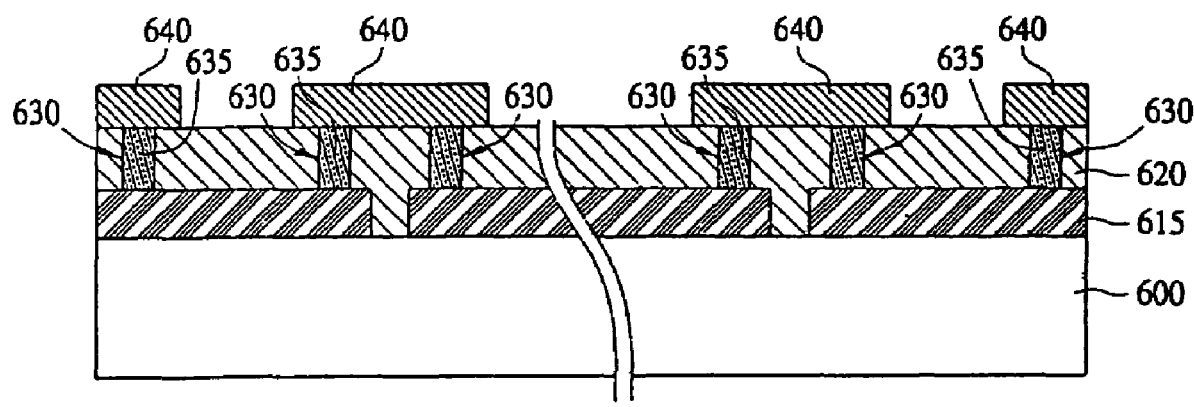

FIGS. 6A and 6B are drawings illustrating planar structure and cross-sectional schemes of a semiconductor device comprising a metal pattern (i.e., functional conductive pattern) connected with a long load resistor through a contact according to the third embodiment of the present invention.

As shown in FIG. 6A, the semiconductor device according to the third embodiment of the present invention comprises the considerably long load resistor 610 with a zigzag shape, insulated electrically and physically. The load resistor 610 is divided into at least one resistor pattern 615, and both ends of the load resistor 610, respectively, comprises a contact 630 connected with the metal pattern 640.

Additionally, the semiconductor device comprises at least one metal pattern (functional conductive pattern 640) connected with the divided-resistor patterns 615 of the load resistor 610 through a contact 630. In the third embodiment of the present invention, the metal pattern 640 is connected with two neighboring divided-resistor patterns 615 of the load resistor 610 through the contacts 630.

Each metal pattern 640, and the contacts 630 connected to the metal pattern 640 comprise a connection structure for connecting neighboring divided-resistor patterns 615. As shown in FIGS. 6A and 6B, each pair of neighboring divided resistor patterns 615 are connected in series by a corresponding connection structure. Accordingly, a long load resistor is formed by a plurality of divided-resistor patterns 615 connected in series.

In the semiconductor device according to the third embodiment of the present invention, the resistance value of the load resistor 610 is determined by the resistance value of the divided-resistor patterns 615, the contact resistance value of the contacts 630, and the resistance value of the metal patterns 640.

Referring to FIG. 6B, in the method for fabricating the semiconductor device according to the third embodiment of the present invention, a conductive material for the load resistor such as plate polysilicon layer P-Poly is deposited and patterned on the semiconductor substrate 600 to fabricate the considerably long load resistor 610 with a zigzag shape, insulated electrically and physically. In this case, the load resistor 610 is divided into at least one resistor pattern 615.

Sequentially, an insulation layer 620 is deposited and patterned on the semiconductor substrate 600 including the load resistor 610. In more, the insulation layer 620 is dry-etched to fabricate the metal contact 630, and both ends of the divided-resistor pattern 615 of the load resistor 610 are exposed to fabricate the metal contact 630.

The third embodiment of the present invention divides the considerably long load resistor 610 into at least one resistor pattern 615, and fabricates the contact 630 at both ends of the load resistor 610 to dissipate and reduce plasma-etching damage generated on both ends of the load resistor 610 especially. The length of each divided-resistor pattern 615 is determined, with respect to its width and sheet resistance, in order to ensure that an electric charge accumulation does not occur during dry-etching. For example, when a load resistor with a width of 1.7 µm is formed from a plate polysilicon layer having a sheet resistance of 60 $\Omega/cm^2$, the length of each divided-resistor pattern 615 may be set at 9,000 µm. Therefore, when the insulation layer 620 is dry-etched, within the contact 630 of the load resistor 610, phenomena of electric charge build up are prevented, and impurities such as insulating materials are not generated.

Sequentially, the third embodiment of the present invention fills up the contact 630 with a conductive material to fabricate a contact plug 635. In this process, the conductive material for the contact plug 635 uses tungsten W, tungsten suicide WSi, a polysilicon layer, or aluminum Al.

In more, the third embodiment of the present invention deposits a metal layer on the substrate 600, and patterns the metal layer to fabricate at least one metal pattern 640 connected with the divided-resistor pattern 615 of the load resistor 610 through the contact plug 635. Additionally, each of the metal patterns 640 is connected with two neighboring divided-resistor patterns 615 through the contact plug 635.

Although the functional conductive patterns 640 are described above as metal patterns patterned from a deposited metal layer, it will be readily apparent the functional conductive patterns 640 may be patterned from a layer of any other suitable conductive material.

Even though the above embodiments of the present invention illustrate the load resistor with a zigzag shape, it is obvious for the load resistor to have various shapes, such as a linear shape. Additionally, the above disclosure of the present invention describes a metal layer fabrication method of first filling up a contact with a conductive material to generate a contact plug, and then depositing a metal pattern. However, it is possible to fabricate a metal pattern and a contact plug simultaneously.

Furthermore, even though it is not illustrated in the drawings corresponding to the preferred embodiments of the present invention, for certain types of semiconductor devices, DRAM for example, multiple layers, such as conductive layers and/or insulation layers, are normally fabricated on the semiconductor substrate, which includes the load resistor.

As described above, the present invention includes a method, which fabricates at least one contact in a long load resistor to dissipate plasma-etching damage, which is normally concentrated at both ends of the load resistor in the conventional semiconductor device. Specifically, this method makes it possible to prevent the build up of electric charge within a contact of a load resistor, while an insulation layer is dry-etched to fabricate the contact. This helps prevent the generation of impurities, such as insulating materials between the contact of the load resistor and the metal pattern. As a result, it is possible for the contact to provide an optimal connection between the load resistor and the metal pattern. Also, it is also possible to get homogeneous distribution of electric potentials of the load resistor through a fine contact profile.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating a semiconductor device comprising the steps of:
    a) forming a load resistor over a semiconductor substrate;
    b) forming an end contact at each end of the load resistor; and
    c) forming at least one dummy contact between the ends.

2. The method according to claim 1, further comprising:
    forming an insulation layer over the load resistor, wherein
    the step b) forms the end contacts in the insulation layer; and
    the step c) forms the at least one dummy contact in the insulation layer.

3. The method according to claim 2, wherein the step b) includes,
    b1) etching the formed insulation layer to form a contact hole exposing each end of the load resistor; and
    b2) filling the contact holes with a conductive material.

4. The method according to claim 2, wherein the step c) includes,
    c1) etching the formed insulation layer to form at least one dummy contact hole exposing the load resistor at a point between the ends of the load resistor; and
    c2) filling the at least one dummy contact hole with a conductive material.

5. The method according to claim 2, wherein
    the step c) forms first and second dummy contacts,
    the method further comprising:
    d) forming a dummy conductive pattern over the insulation layer, the dummy conductive pattern being connected to the load resistor by the first and second dummy contacts.

6. The method according to claim 5, further comprising:
    e) forming a functional conductive pattern over the insulation layer, the functional conductive pattern being electrically connected to at least one of the ends of the load resistor by at least one of the end contacts.

7. The method according to claim 6, wherein the steps b) and c) are performed simultaneously.

8. A method for fabricating a semiconductor device comprising the steps of:
    a) forming a plurality of divided-resistor patterns over a semiconductor substrate;
    b) forming a plurality of connection structures connecting the divided-resistor patterns in series to form a load resistor; and
    c) forming an contact at each of the load resistor.

9. The method of claim 8, wherein the step a) forms each of the plurality of divided-resistor patterns to have an associated length, width, and sheet resistance, the length being determined with respect to the width and sheet resistance such that no substantial electric charge build up occurs in the connection structures when an etching process is performed on the semiconductor device.

10. The method of claim 8, wherein the step a) forms each of the plurality of divided-resistor patterns to have an associated width of 1.7 µm, an associated sheet resistance of 60 Ω/cm², and an associated length of no more than 9,000 µm.

11. The method according to claim 9, further comprising:
    forming an insulation layer over the plurality of divided-resistor patterns; and wherein
    the step b) includes,
    b1) forming a functional conductive pattern over the insulation layer; and
    b2) forming first and second connection contacts in the insulation layer to electrically connect the functional conductive pattern to first and second divided-resistor patterns, respectively, and thereby connect the first and second divided-resistor patterns in series.

12. The method according to claim 11, wherein the step b2) includes,
    b2-1) etching the insulation layer to form a first contact hole at an end of the first divided-resistor pattern and a second contact hole at an end of the second divided-resistor pattern, the first contact hole exposing the end of the first divided-resistor pattern and the second contact hole exposing the end of the second divided-resistor pattern; and
    b2-2) filling the first and second contact holes with a conductive material.

13. The method of claim 11, wherein the step a) respectively forms each of the first and second divided-resistor patterns to have an associated length, the length being determined with respect to the width and sheet resistance of the divided-resistor pattern such that no substantial electric charge build up occurs in the first and second contacts during the step b).

14. The method of claim 11, wherein the step a) forms each of the first and second divided-resistor patterns to have an associated width of 1.7 µm, an associated sheet resistance of 60 Ω/cm², and an associated length of no more than 9,000 µm.

* * * * *